US010522529B2

(12) United States Patent
Franck et al.

(10) Patent No.: US 10,522,529 B2
(45) Date of Patent: Dec. 31, 2019

(54) CIRCUIT FOR PROVIDING ELECTROSTATIC DISCHARGE PROTECTION ON AN INTEGRATED CIRCUIT AND ASSOCIATED METHOD AND APPARATUS

(71) Applicant: Mellanox Technologies Denmark ApS, Roskilde (DK)

(72) Inventors: Thorkild Franck, Roskilde (DK); Allan Green-Petersen, Smoerum (DK)

(73) Assignee: MELLANOX TECHNOLOGIES DENMARK APS, Roskilde (DK)

( * ) Notice: Subject to any disclaimer, the term of this patent is extended or adjusted under 35 U.S.C. 154(b) by 53 days.

(21) Appl. No.: 15/864,545

(22) Filed: Jan. 8, 2018

(65) Prior Publication Data

US 2019/0214378 A1   Jul. 11, 2019

(51) Int. Cl.
| | | |
|---|---|---|
| *H01L 27/02* | (2006.01) | |
| *H01L 21/66* | (2006.01) | |
| *H01L 23/00* | (2006.01) | |
| *H01L 23/528* | (2006.01) | |
| *H01L 23/66* | (2006.01) | |
| *G01R 31/00* | (2006.01) | |
| *G01R 31/28* | (2006.01) | |
| *H02H 9/04* | (2006.01) | |

(52) U.S. Cl.
CPC ........ *H01L 27/0248* (2013.01); *G01R 31/002* (2013.01); *G01R 31/2851* (2013.01); *H01L 22/32* (2013.01); *H01L 23/5286* (2013.01); *H01L 23/66* (2013.01); *H01L 24/05* (2013.01); *H02H 9/04* (2013.01); *H01L 2223/6638* (2013.01); *H01L 2224/04042* (2013.01); *H01L 2224/05025* (2013.01)

(58) Field of Classification Search
None
See application file for complete search history.

(56) References Cited

U.S. PATENT DOCUMENTS

| | | | |
|---|---|---|---|
| 5,610,790 A * | 3/1997 | Staab | .................. H01L 27/0255 361/111 |
| 5,969,929 A | 10/1999 | Kleveland et al. | |
| 6,522,511 B1 | 2/2003 | John et al. | |
| 2015/0108996 A1 | 4/2015 | Vaucher et al. | |

* cited by examiner

*Primary Examiner* — Clayton E. LaBalle
*Assistant Examiner* — Jas A Sanghera
(74) *Attorney, Agent, or Firm* — Alston & Bird LLP

(57) ABSTRACT

A circuit providing electrostatic discharge (ESD) protection and a method and an apparatus for testing ESD protection on an integrated circuit are described. The circuit includes a first ESD protection circuit and a test pad and a second ESD protection circuit and a second pad for the application, not probed during manufacturing of the integrated circuit. In some examples, the method includes providing a first, second, third, and fourth test current to the circuit providing ESD protection, measuring a first second, third, and fourth voltage drop across the circuit, and determining an operating condition for the first ESD protection circuit and the test pad and the second ESD protection circuit and the second bond pad based on expected values of the first voltage drop, the second voltage drop, the third voltage drop, and the fourth voltage drop.

20 Claims, 6 Drawing Sheets

Example Expected Results

|  |  | First ESD Protection Circuit | | | | | |
|---|---|---|---|---|---|---|---|
|  |  | Normal | Short | Open | Normal | Short | Open |
| Second ESD Protection Circuit | Normal | 0.9 V | 0 V | 0.9 V | 1.4 V | 0 V | 2.7 V |
|  | Short | 0.2 V | 0 V | 0.2 V | 1.4 V | 0 V | 2 V |
|  | Open | 1.4 V | 0 V | PMU Clamp | 1.4 V | 0 V | PMU Clamp |
|  |  | First Test Current: 100µA | | | Second Test Current: 1 mA | | |

FIG. 5

CIRCUIT FOR PROVIDING ELECTROSTATIC DISCHARGE PROTECTION ON AN INTEGRATED CIRCUIT AND ASSOCIATED METHOD AND APPARATUS

TECHNOLOGICAL FIELD

Embodiments of the present invention relate generally to providing electrostatic discharge (ESD) protection on an integrated circuit and testing the ESD protection on the integrated circuit.

BACKGROUND

This present invention relates to the production of integrated circuits and the testing of electrostatic discharge (ESD) protection on the integrated circuits. During the production of integrated circuit wafers, flaws may arise which then cause the ESD protection and connected metallization on the wafer to not function properly during the use of the integrated circuit.

BRIEF SUMMARY

Embodiments of the present invention include a circuit for providing and testing electrostatic discharge (ESD) protection on an integrated circuit.

The circuit topology described herein allows for detection of the presence of ESD protection on both a pad required for the application (e.g., a wire bond pad, a pad with a solder bump, a pad with a copper pillar, or other packaging technologies, herein referred to as wire bond pad), and a test pad of an ESD circuit while probing only the test pad, in conjunction with a method for testing the ESD protection on an integrated circuit which includes providing a higher level current and a lower level current (and the inverse or negative currents corresponding to the higher level and lower level currents) through the test pad. The lower level current(s) provide information relevant to ESD protection operating conditions of the wire bonding pad and the higher level current(s) provide information relevant to the ESD protection operating condition of the test pad.

In this regard, the invention includes: A circuit for providing electrostatic discharge (ESD) protection comprising: a signal line; a first ESD protection circuit on the signal line comprising: at least one ESD diode connected between the signal line and a supply rail; at least one ESD diode connected between a ground rail and the signal line, wherein the first ESD protection circuit provides a first forward voltage level; a second ESD protection circuit on the signal line comprising: at least one ESD diode connected between the signal line and the supply rail; at least one ESD diode connected between the ground rail and the signal line, wherein the second ESD protection circuit provides a second forward voltage level lower than the first forward voltage level of the first ESD protection circuit; and a resistor on the signal line between the first ESD protection circuit and the second ESD protection circuit.

In one example, the signal line is connected from the second ESD protection circuit to an electrically sensitive circuit, wherein the circuit is configured to receive a test current, and wherein the first ESD protection circuit and the second ESD protection circuit provide ESD protection. In one example embodiment, the circuit is a part of a differential topology in which the circuit is connected to a differential circuit by a differential resistor.

In one example, the differential circuit comprises: a differential signal line; a first differential ESD protection circuit on the differential signal line comprising: at least one ESD diode connected between the differential signal line and the supply rail; at least one ESD diodes connected between the ground rail and the differential signal line; and a second differential ESD protection circuit on the differential signal line comprising: at least one ESD diode connected between the differential signal line and the supply rail; at least one ESD diode connected between the ground rail and the differential signal line; and a resistor on the differential signal line between the first differential ESD protection circuit and the second differential ESD protection circuit. In one example, the differential resistor is a 100 Ohm resistor.

In one example embodiment, the first ESD protection circuit comprises: at least two ESD diodes connected in series between the signal line and the supply rail; at least two ESD diodes connected in series between the ground rail and the signal line; and wherein the second ESD protection circuit comprises a fewer number of ESD diodes than the first ESD protection circuit.

In another example embodiment, a method for testing electrostatic discharge (ESD) protection on an integrated circuit is provided. The method including: providing a first test current to a circuit for testing ESD protection, wherein the circuit for testing ESD protection comprises: a signal line; a first ESD protection circuit on the signal line comprising: at least one ESD diode connected between the signal line and a supply rail; at least one ESD diode connected between a ground rail and the signal line, wherein the first ESD protection circuit provides a first forward voltage level; a second ESD protection circuit on the signal line comprising: at least one ESD diode connected between the signal line and the supply rail; at least one ESD diode connected between the ground rail and the signal line, wherein the second ESD protection circuit provides a second forward voltage level lower than the first forward voltage level of the first ESD protection circuit ESD protection circuit; and a resistor on the signal line between the first ESD protection circuit and the second ESD protection circuit; measuring a first voltage drop across the circuit to the supply rail; providing a second test current to the circuit; measuring a second voltage drop across the circuit to the supply rail; providing a third test current to the circuit, wherein the third test current is a negative of the first test current; measuring a third voltage drop across the circuit to the ground rail; providing a fourth test current to the circuit wherein the fourth test current is a negative of the second test current; measuring a fourth voltage drop across the circuit to the ground rail; and determining an operating condition for the first ESD protection circuit and the second ESD protection circuit based on expected values of the first voltage drop, the second voltage drop, the third voltage drop, and the fourth voltage drop.

In one example, the first test current corresponds to a first voltage that is lower than the first forward voltage level and at least equal to the second forward voltage level; and wherein the second test current corresponds to a second voltage that is at least equal to the first forward voltage level.

In one example, the first ESD protection circuit and the second ESD protection circuit are connected to ground during a test of ESD protection on the integrated circuit.

In one example, the signal line is connected to an electrically sensitive circuit, wherein the circuit is further connected to an input pad, wherein the first ESD protection circuit and the second ESD protection circuit provide ESD protection, and wherein the input pad is floating in an instance in which the circuit is not being tested.

In one example, the circuit is a part of a differential topology in which the circuit is connected to a differential circuit by a differential resistor.

In one example, the differential circuit comprises: a differential signal line; a first differential ESD protection circuit on the differential signal line comprising: at least one ESD diode connected between the differential signal line and the supply rail; at least one ESD diode connected between the ground rail and the differential signal line; and a second differential ESD protection circuit on the differential signal line comprising: at least one ESD diode connected between the differential signal line and the supply rail; at least one ESD diode connected between the ground rail and the differential signal line; and a resistor on the differential signal line between the first differential ESD protection circuit and the second differential ESD protection circuit.

In one example, the differential resistor is a 100 Ohm resistor.

In another example embodiment, an apparatus for testing electrostatic discharge (ESD) protection on an integrated circuit is provided. The apparatus comprising at least one processor and at least one memory including computer program code, the at least one memory and the computer program code configured to, with the processor, cause the apparatus to at least: provide a first test current to a circuit for testing ESD protection, wherein the circuit for testing ESD protection comprises: a signal line; a first ESD protection circuit on the signal line comprising: at least one ESD diode connected between the signal line and a supply rail; at least one ESD diode connected between a ground rail and the signal line, wherein the first ESD protection circuit provides a first forward voltage level; a second ESD protection circuit on the signal line comprising: at least one ESD diode connected between the signal line and the supply rail; at least one ESD diode connected between the ground rail and the signal line, wherein the second ESD protection circuit provides a second forward voltage level lower than the first forward voltage level of the first ESD protection circuit ESD protection circuit; and a resistor on the signal line between the first ESD protection circuit and the second ESD protection circuit; measure a first voltage drop across the circuit to the supply rail; provide a second test current to the circuit; measure a second voltage drop across the circuit to the supply rail; provide a third test current to the circuit, wherein the third test current is a negative of the first test current; measure a third voltage drop across the circuit to the ground rail; provide a fourth test current to the circuit wherein the fourth test current is a negative of the second test current; measure a fourth voltage drop across the circuit to the ground rail; and determine an operating condition for the first ESD protection circuit and the second ESD protection circuit based on expected values of the first voltage drop, the second voltage drop, the third voltage drop, and the fourth voltage drop.

In one example, the first test current corresponds to a first voltage that is lower than the first forward voltage level and at least equal to the second forward voltage level; and wherein the second test current corresponds to a second voltage that is at least equal to the first forward voltage level.

In one example, the first ESD protection circuit and the second ESD protection circuit are connected to ground during a test of ESD protection on the integrated circuit.

In one example embodiment, the signal line is connected to an electrically sensitive circuit, wherein the circuit is further connected to an input pad, wherein the first ESD protection circuit and the second ESD protection circuit provide ESD protection, and wherein the input pad is floating in an instance in which the circuit is not being tested.

In one example, the circuit is a part of a differential topology and wherein the circuit is connected to a differential circuit by a differential resistor, wherein the differential resistor is a 100 Ohm resistor and wherein the differential circuit comprises: a differential signal line; a first differential ESD protection circuit on the differential signal line comprising: at least one ESD diode connected between the differential signal line and the supply rail; at least one ESD diode connected between the ground rail and the differential signal line; and a second differential ESD protection circuit on the differential signal line comprising: at least one ESD diode connected between the differential signal line and the supply rail; at least one ESD diode connected between the ground rail and the differential signal line; and a resistor on the differential signal line between the first differential ESD protection circuit and the second differential ESD protection circuit.

BRIEF DESCRIPTION OF THE DRAWINGS

Figure 1A:
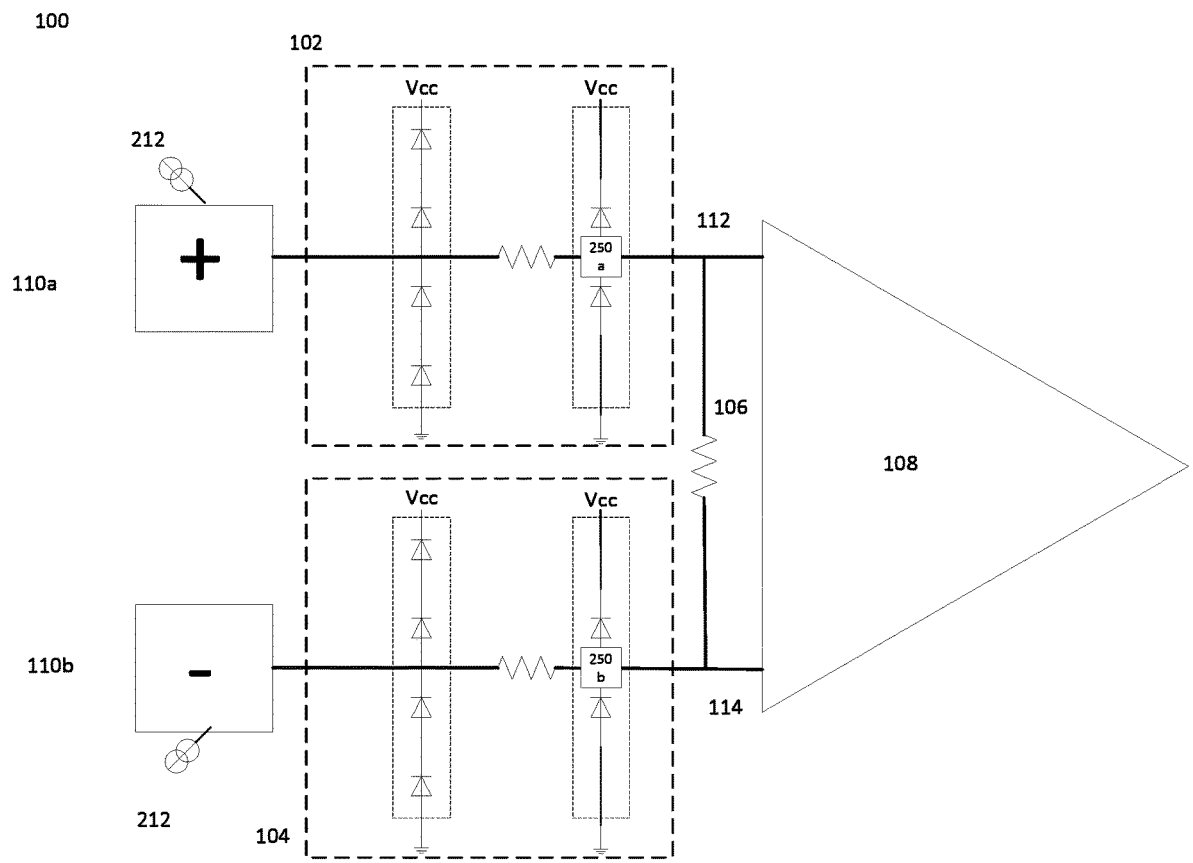
Figure 1B:
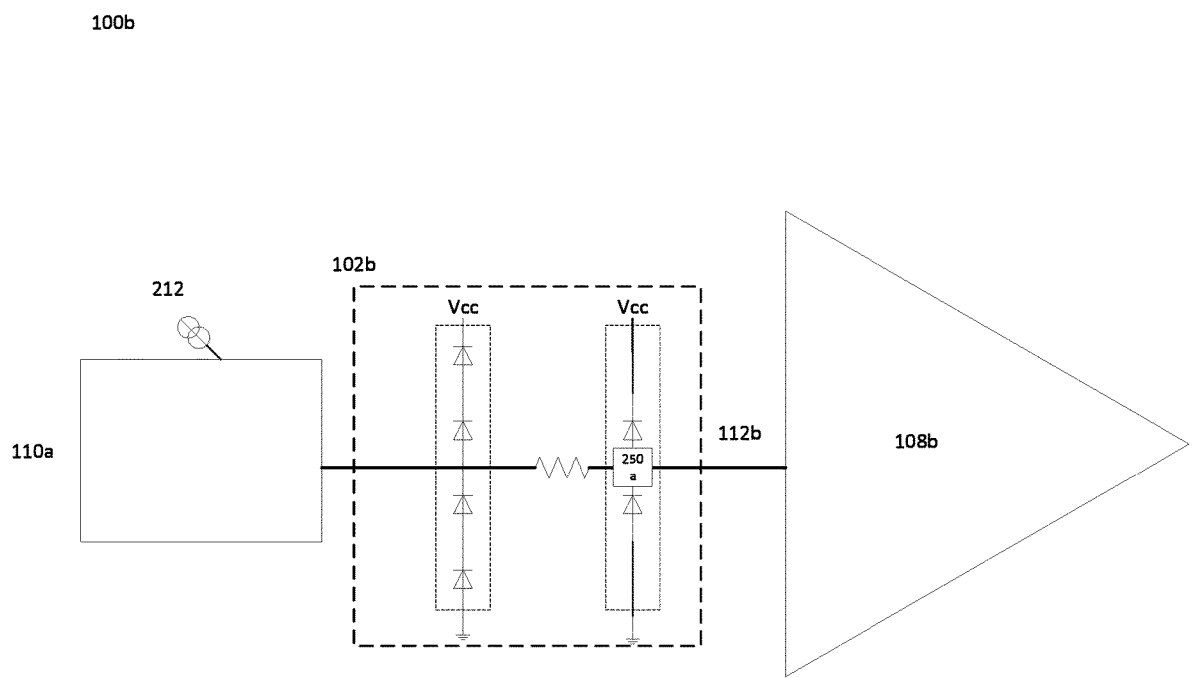
Figure 2:
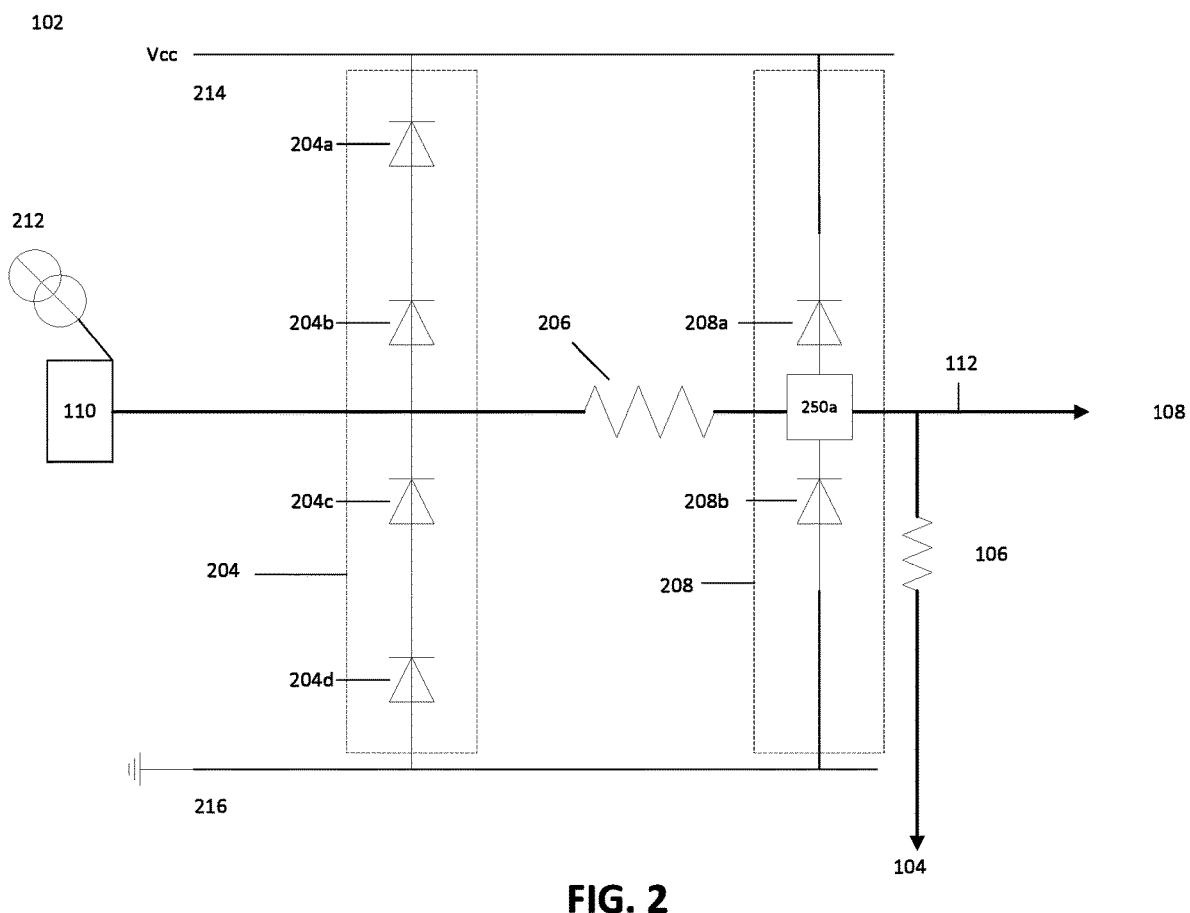
Figure 3:
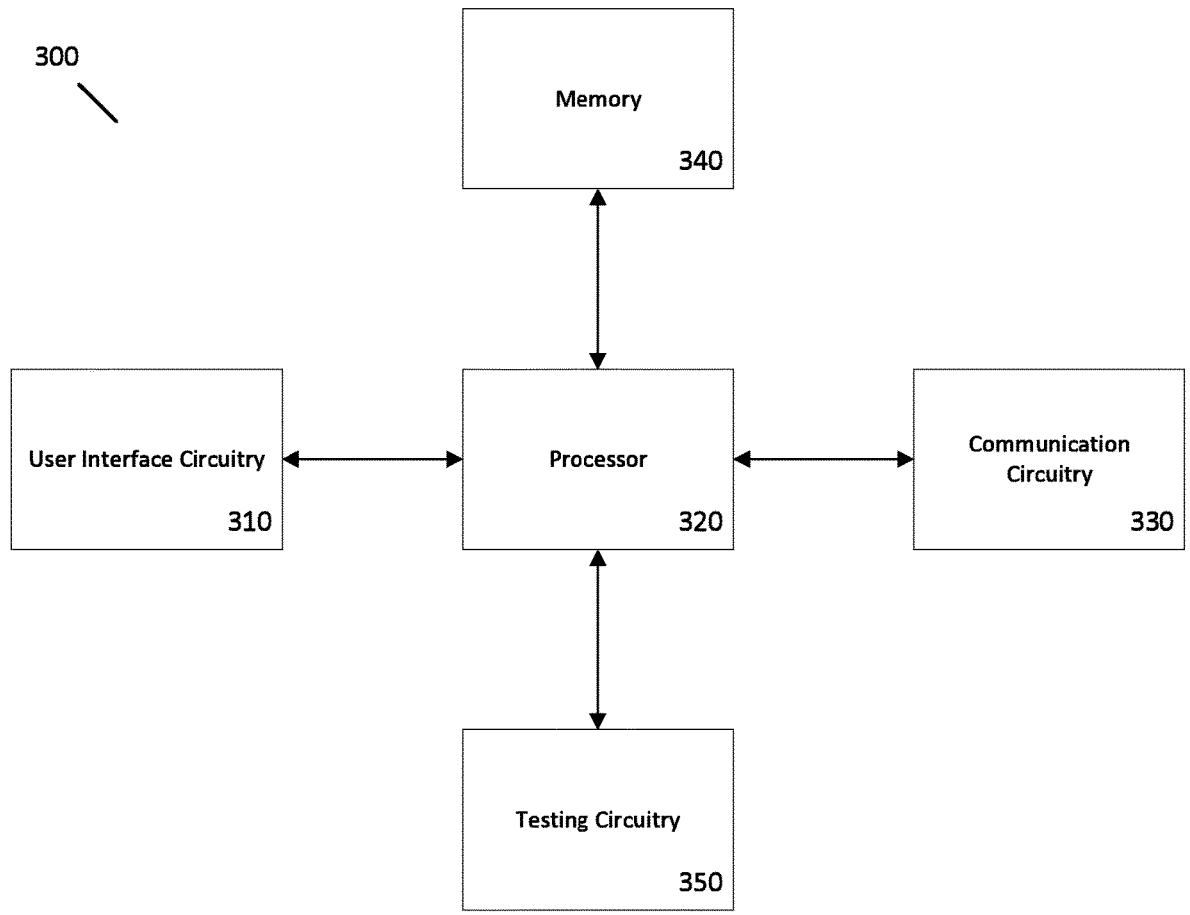
Figure 4:
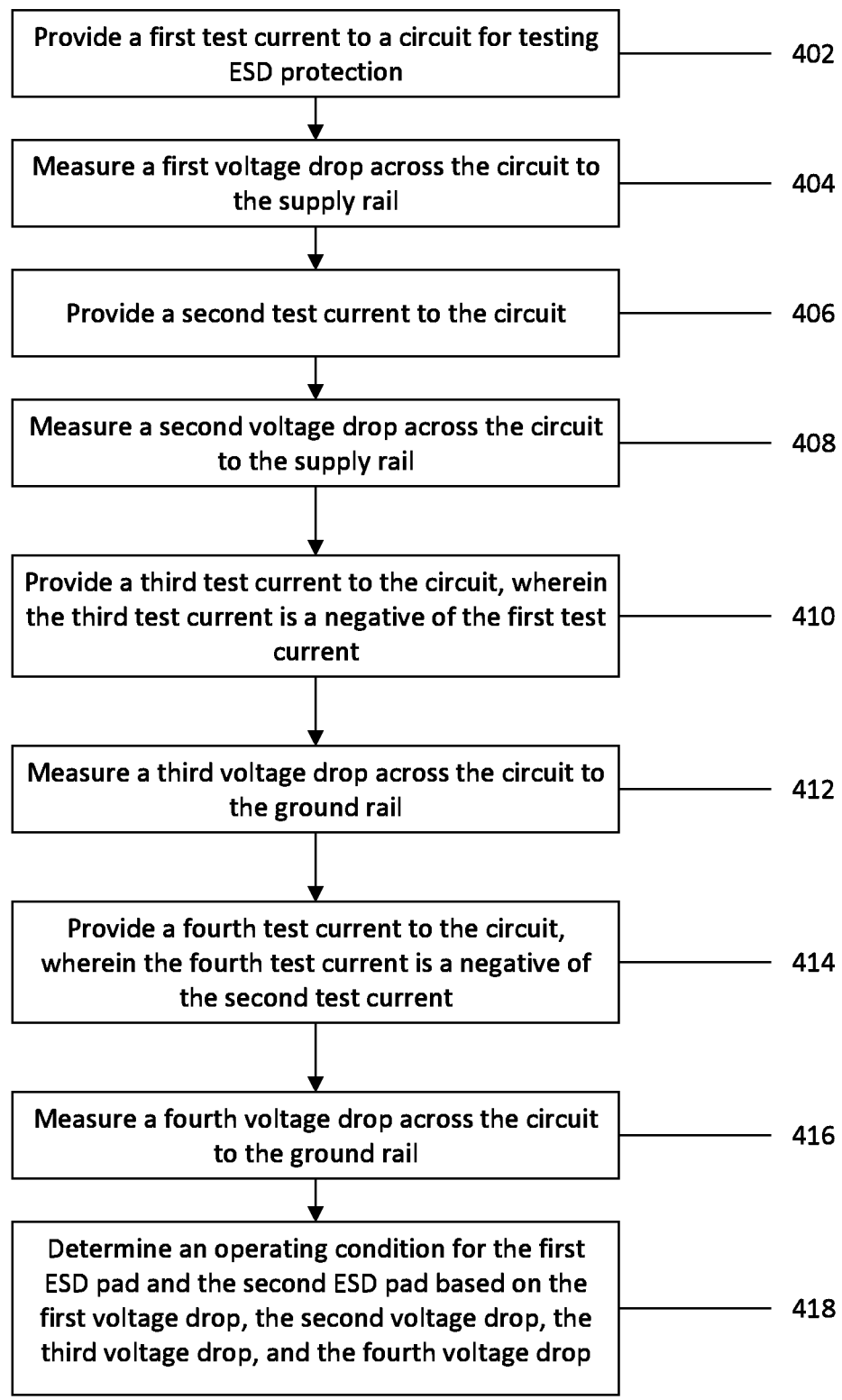

Having thus described embodiments of the invention in general terms, reference will now be made to the accompanying drawings, which are not necessarily drawn to scale, and wherein:

FIG. 1A illustrates differential ESD protection on an integrated circuit according to example embodiments described herein;

FIG. 1B illustrates single ended ESD protection on an integrated circuit according to example embodiments described herein;

FIG. 2 illustrates exemplary ESD protection circuitry according to example embodiments described herein;

FIG. 3 illustrates a block diagram of an example apparatus for testing ESD protection on an integrated circuit;

FIG. 4 is a flowchart illustrating an example method for testing ESD protection on an integrated circuit; and FIG. 5 is a table of operating conditions of ESD circuitry based on expected values of a first voltage drop and a second voltage drop across ESD protection circuitry.

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "data," "content," "information," and similar terms may be used interchangeably, according to some example embodiments, to refer to data capable of being transmitted, received, operated on, and/or stored. Moreover, the term "exemplary," as may be used herein, is not provided to convey any qualitative assessment, but instead merely to convey an illustration of an example. Thus, use of any such terms should not be taken to limit the spirit and scope of embodiments of the present invention.

Presently, limitations in the process for manufacturing and producing semiconductor integrated circuits requires a pad for wire bonding ("high speed pad"). The pad for wire bonding cannot be probed as part of the production of the wafer, since mechanical damage may occur to the wire bonding pad during a test probe. Thus, to enable electrical connection to the integrated circuit to test the circuitry behind the wire bonding pad, a test pad ("DC pad") is added, wherein the test pad can be probed during a production wafer test. Due to the sensitive nature of the circuitry in an integrated circuit, the wire bonding pad and the test pad must be protected for electrostatic discharge by connecting ESD protection diodes to the pads. Present methods for testing ESD protection on the pads comprise pulsing a small current through the pads and measuring the voltage drop across the diodes. However, the present methods fail to capture all possible operating conditions for the ESD diodes on both pads, such that ESD diodes on one or both pads or the metallization connecting the pads may not be functioning properly (e.g., may be shorted or open).

FIG. 1A illustrates differential ESD protection on an integrated circuit 100 according to embodiments described herein. The integrated circuit 100 may comprise one of several integrated circuits embedded in a device or connector such as a cable interconnector. As shown, the integrated circuit includes a differential pair of input pads or an input/output pad, such as an I/O pad 110. The I/O pad 110 may be operatively connected to an I/O component to provide a signal, such as a data signal, to sensitive circuitry 108 utilizing signal lines 112 and 114. The signal lines 112 and 114 in FIG. 1A pass through both a test pad(s) and a wire bonding pad 250a (and/or wire bonding pad 250b) between the I/O pads 110a and/or 110b and the sensitive circuitry 108. The sensitive circuitry 108 may comprise circuitry of the integrated circuit 100, which performs the functions, operations, and/or algorithms of the integrated circuit 100. The sensitive circuitry 108 is protected from ESD discharge by circuit 102 and circuit 104 which provide ESD protection on both the signal line 112 and the signal line 114. In some examples, the circuit 102 and the circuit 104 are also connected by a resistor 106.

FIG. 1B illustrates single ended ESD protection on an integrated circuit 100b according to embodiments described herein. The integrated circuit 100b may comprise one of several integrated circuits embedded in a device or connector such as a cable interconnector. As shown, the integrated circuit may include an input pad or an input/output pad, such as an I/O pad 110b. The I/O pad 110b may be single ended and may be connected to an I/O component to provide a signal, such as a data signal, to sensitive circuitry 108b utilizing a signal line. The signal line 112b in FIG. 1B passes through both a test pad and a wire bonding pad 250a between the I/O pad 110b and the sensitive circuitry 108. The sensitive circuitry 108b may comprise circuitry of the integrated circuit 100b, which performs the functions, operations, and/or algorithms of the integrated circuit 100b. The sensitive circuitry 108b may be protected from ESD discharge by circuit 102b, which provides single ended ESD protection on the signal line 112b, FIG. 2 illustrates an example circuit 102 for ESD protection, which provides ESD protection on the signal line 112. The circuit 102 in the depicted embodiment includes the signal line 112, which is connected through ESD protection circuits 204 and 208 on the signal line 112. The first ESD protection circuit 204 may include at least one ESD diode connected in series (or stacked) between the signal line 112 and a connection for conducting an ESD current such as a supply rail of the integrated circuit 100, such as supply rail 214. The first ESD protection circuit 204 may also include at least one ESD diode connected in series between a ground rail of the integrated circuit 100, such as ground rail 216, and the signal line 112. In some examples, the first ESD protection circuit 204 may include at least ESD diodes connected in series between the signal line 112 and the supply rail of the integrated circuit 100.

The at least one ESD diodes connected in series between the signal line 112 and the supply rail 214 are illustrated as two ESD diodes 204a and 204b in FIG. 2. The at least two ESD diodes connected in series between the ground rail 216 and the signal line 112 are illustrated as two ESD diodes 204c and 204d in FIG. 2. The ESD diodes 204a, 204b, 204c, and 204d may comprise ESD protection diodes, wherein each of the diodes includes a forward voltage of 0.7 Volts (V). In some examples, multiple different types of diodes may be used on the first pad to provide a first forward voltage. The combined forward voltage levels of the diodes in series results in the first ESD protection circuit of the depicted embodiment providing a first forward voltage level of 1.4V across the diode series (e.g., between the signal line 112 and the supply rail 214 and between the signal line 112 and the ground rail 216).

The circuit 102 in FIG. 2 includes a second ESD protection circuit 208, and the signal line 112 is also connected through the second ESD protection circuit 208 (e.g., a high speed pad or a wire bonding pad 250a) on the signal line 112. The second ESD protection circuit 208 may include at least one ESD diode connected between the signal line 112 and the supply rail 214. The second ESD protection circuit 208 may also include at least one ESD diode connected between the ground rail 216 and the signal line 112.

The at least one ESD diode connected between the signal line 112 and the supply rail 214 is illustrated in FIG. 2 as ESD diode 208a. The at least one ESD diode connected between the signal between the ground rail 216 and the signal line 112 is illustrated in FIG. 2 as ESD diode 208b. The ESD diodes 208a and 208b may also comprise ESD protection diodes, wherein each of the diodes includes a forward voltage of 0.7 V. In some examples, if the at least one ESD diode comprises more than one ESD diode, the ESD diodes are connected in series. As shown in FIG. 2, the at least one diode in the second ESD protection circuit provides a second forward voltage level of 0.7 V across the diode (e.g., between the signal line 112 and the supply rail 214 and between the signal line 112 and the ground rail 216). In some embodiments, the second ESD protection circuit 208 comprises a fewer number of ESD diodes than the first ESD protection circuit 204. In another example, the second ESD protection circuit 208 and the first ESD protection circuit 204 comprise the same number of ESD diodes, but the forward voltages of the ESD diodes of the first ESD protection circuit may be higher (e.g., 0.7 V) than the forward voltages of the ESD diodes of the second ESD protection circuit (e.g., 0.4 V).

As also shown in FIG. 2, the circuit 102 may include a resistor 206 on the signal line 112 between the first ESD protection circuit 204 and the second ESD protection circuit 208. The resistor 206 may provide a change in voltage which, along with the difference between the first forward voltage and the second forward voltage, allows for the determination of the operating status of both the first ESD protection circuit 204 and the second ESD protection circuit 208. In some examples, the resistor 206 comprises a 2000 Ohm resistor or a 10000 Ohm resistor.

In some embodiments of the circuit 102, the signal line 112 is connected to the electrically sensitive circuit (sensitive circuitry 108). The signal line may also be further connected to the input/output pad 110. The circuit 102 may be configured to receive a test current from a current source 212 during testing of the circuit 102.

As illustrated in FIG. 1A, in some embodiments, the circuit 102 is part of a differential topology in which the circuit 102 is connected to a differential circuit (e.g., circuit 102) by a differential resistor (e.g., resistor 106). As also shown in FIG. 1A, the differential circuit (e.g., circuit 104) is constructed in a substantially similar manner to the circuit 102. For example, the differential circuit (e.g., circuit 104) as depicted also includes a differential signal line and a first differential ESD protection circuit on the differential signal line comprising at least two ESD diodes connected in series (or stacked) between the differential signal line and the supply rail and at least two ESD diodes connected in series between the ground rail and the differential signal line. The differential circuit (e.g., circuit 104) may also include a second differential ESD protection circuit on the differential signal line comprising at least one ESD diode connected between the differential signal line and the supply rail and at least one ESD diodes connected between the ground rail and the differential signal line. The differential circuit (e.g., circuit 104) may also further include a resistor (e.g., resistor 206) on the differential signal line between the first differential ESD protection circuit and the second differential ESD protection circuit. In some examples, the differential resistor (e.g., resistor 106) is a 100 Ohm resistor.

FIG. 3 illustrates a block diagram of an example apparatus 300 for testing ESD protection on an integrated circuit. The apparatus of FIG. 3 may be incorporated into or embodied by a computing device that includes a display in which the determined operating conditions of the ESD protection circuit may be displayed. For example, the apparatus may be embodied by a mobile computing device or a fixed computing device that includes the display. Alternatively, the apparatus may be separate from the computing device or at least separate from the display that is associated with the computing device, but the apparatus of this embodiment may be in communication with the computing device through wired or wireless communication methods, in order to present a visual representation of the determined operating conditions of the ESD protection circuit on the display.

Additionally, while FIG. 3 illustrates one example of a configuration of an apparatus 300 for testing ESD protection on an integrated circuit, other configurations may also be used to implement example embodiments described herein. In the depicted embodiments, separate components or circuitry of the apparatus 300 are shown as being in communication with each other, however, it should be understood that the components and circuitry illustrated may be embodied within the same device or element and thus components or circuitry of apparatus 300 shown in communication should be understood to alternatively be components of the same device or element.

The apparatus 300 may include or otherwise be in communication with a processor 320, memory circuitry 340, communication circuitry 330, user interface circuitry 310, and/or testing circuitry 350. In some embodiments, the processor 320 (which may include multiple or co-processors or any other processing circuitry associated with the processor) may be in communication with the memory circuitry 340. The memory circuitry 340 may comprise non-transitory memory circuitry and may include one or more volatile and/or non-volatile memories. In some examples, the memory circuitry 340 may be an electronic storage device (e.g., a computer readable storage medium) comprising gates configured to store data (e.g., bits) that may be retrievable by the processor 320. The memory circuitry 340 may also be configured to store information, data, content, applications, computer program instructions (or computer program code) or the like for enabling the apparatus to carry out various functions or methods in accordance with the example embodiment of the present invention, described herein.

As described above, the apparatus 300 may be embodied by a computing device, such as a mobile terminal or a fixed computing device. In some embodiments, the apparatus may be embodied as a chip or chip set. For example, the apparatus may comprise one or more physical packages (e.g., chips) including materials, components, and/or wires on a structural assembly.

In some examples, the processor 320 may be embodied in a number of different ways. For example, the processor may be embodied as one or more of various hardware processing means such as a microprocessor, a coprocessor, a digital signal processor (DSP), a controller, a processing element with or without an accompanying DSP. The processor 320 may also be embodied on various other processing circuitry including integrated circuits such as, for example, an FPGA (field programmable gate array), a microcontroller unit (MCU), an ASIC (application specific integrated circuit), a hardware accelerator, or a special-purpose electronic chip. Furthermore, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining, and/or multi-threading.

In an example embodiment, the processor 320 may be configured to execute instructions stored in the memory circuitry 340 or otherwise accessible to the processor 320. Alternatively or additionally, the processor 320 may be configured to execute hard-coded functionality. As such, whether configured by hardware or software instructions, or by a combination thereof, the processor 320 may represent a computing entity (e.g., physically embodied in circuitry) configured to perform operations according to an embodiment of the present invention described herein. For example, when the processor 320 is embodied as an ASIC, FPGA, or similar, the processor may be configured as hardware for conducting the operations of an embodiment of the invention. Alternatively, when the processor 320 is embodied to execute software or computer program instructions, the instructions may specifically configure the processor 320 to perform the algorithms and/or operations described herein when the instructions are executed. However, in some cases, the processor 320 may be a processor of a device (e.g., a mobile terminal or a fixed computing device) specifically configured to employ an embodiment of the present invention by further configuration of the processor by instructions for performing the algorithms and/or operations described herein. The processor 320 may further include a clock, an arithmetic logic unit (ALU) and logic gates configured to support operation of the processor 320, among other things.

In some embodiments, the communication circuitry 330 may be a device or circuitry embodied in either hardware or a combination of hardware and software that is configured to receive and/or transmit data from/to a network and/or any other device or module in communication with the apparatus 300, such as the computing device that includes or is otherwise associated with the display upon which visual representation(s) of the determined operating conditions of the ESD protection circuit are presented in instances in which the apparatus is separate from the computing device and/or the display. In this regard, the communication circuitry 330 may include, for example, an antenna and supporting hardware and/or software for enabling communications with a wireless communication network. In some examples, the communication circuitry 330 may alternatively or also support wired communication. As such, for example, the communication interface may include a communication modem and/or other hardware/software for supporting communication via cable, universal serial bus (USB), digital subscriber line (DSL), or other mechanisms.

In some embodiments, the user interface circuitry 310 is in communication with the processor 320 to provide output to a user and, in some embodiments, to receive a user input. For example, the user interface circuitry 310 may be configured to communicate with the display and, in some embodiments, may also may be configured to communicate with a keyboard, a mouse, one or more microphones, a speaker, or other input/output mechanisms. In one embodiment, the user interface includes the display upon which visual representation(s) of the determined operating conditions are presented. The processor 320 and/or user interface circuitry 310 may further be configured to control one or more functions of one or more user interface elements through computer program instructions (e.g., software and/or firmware) stored on the memory circuitry 340.

In some embodiments, the testing circuitry 350 is in communication with the processor 320 to enable or otherwise provide the functions of the methods described herein for testing ESD protection on an integrated circuit. For example, the testing circuitry 350 may be configured to communicate with testing components such as a test current supply component and a voltage measurement component. The processor 320 and/or testing circuitry 350 may further be configured to control one or more functions of one or more user testing components through computer program instructions (e.g., software and/or firmware) stored on the memory circuitry 340.

FIG. 4 is a flowchart illustrating an example method for testing ESD protection on an integrated circuit. The operations performed, such as by the apparatus 300 of FIG. 3, in accordance with an example embodiment of the method are illustrated. As shown in block 402, the apparatus 300, including the processor 320 and testing circuitry 350, may be configured to provide a first test current to a circuit for testing ESD protection, such as circuit 102 of FIG. 1A. In some examples, the first test current corresponds to a first voltage that is lower than the first forward voltage level and at least equal to the second forward voltage level for a nominal outcome of a manufactured integrated circuit with no defects in the ESD protection circuits. For the depicted example of the circuit 102, of FIG. 2, the first forward voltage is 1.4 V and the second forward voltage is 0.7 V. Thus in the example of described above, the first test current corresponds to a first voltage ranging from 0.7 V up to but not including 1.4 V. In some examples, the first ESD protection circuit 204 and the second ESD protection circuit 208 are connected to ground during a test of ESD protection on the integrated circuit. For example, the supply rail 214 may be grounded during the testing of the circuit 102. Furthermore, in some example embodiments on of the individual pads in the differential I/O pad 110 is floating or not electrically connected in an instance in which the circuit is not being tested.

As shown in block 404, the apparatus 300, including the processor 320 and the testing circuitry 350, may be configured to measure a first voltage drop across the circuit to the supply rail 214. This measurement may provide information relevant to the operating condition of the ESD diode 208a.

As shown in block 406, the apparatus 300, including the processor 320 and testing circuitry 350, may be configured to provide a second test current to the circuit for testing ESD protection. In some examples, the second test current may correspond to a second voltage that is at least equal to the first forward voltage level. For the depicted circuit 102, as described in relation to FIG. 2, the second test current corresponds to a voltage of at least 1.4 V.

As shown in block 408, the apparatus 300, including the processor 320 and the testing circuitry 350, may be configured to measure a second voltage drop across the circuit 102 to the supply rail 214. This measurement may provide information relevant to the operating condition of the ESD diodes 204a and 204b.

As shown in block 410, the apparatus 300, including the processor 320 and the testing circuitry 350, may be configured to provide a third test current to the circuit, wherein the third test current is a negative of the first test current. For example, if the first test current is 100 microamperes (μA), the third test current is −100 μA.

As shown in block 412, the apparatus 300, including the processor 320 and the testing circuitry 350, may be configured to measure a third voltage drop across the circuit 102 to the ground rail 216. This measurement may provide information relevant to the operating condition of the ESD diode 208b.

As shown in block 414, the apparatus 300, including the processor 320 and the testing circuitry 350, may be configured to provide a fourth test current to the circuit 102 wherein the fourth test current is a negative of the second test current. For example, if the second test current is approx. 1 milliamperes (mA), the fourth test current is approx. −1 mA.

As shown in block 416, the apparatus 300, including the processor 320 and the testing circuitry 350, may be configured to measure a fourth voltage drop across the circuit 102 to the ground rail 216. This measurement may provide information relevant to the operating condition of the ESD diodes 204c and 204d.

As shown in block 418, the apparatus 300, including the processor 320 and the testing circuitry 350, may be configured to determine an operating condition for the first ESD protection circuit 204 and the connected metal and the second ESD protection circuit 208 based on expected values of the first voltage drop, the second voltage drop, the third voltage drop, and the fourth voltage drop. The expected values may be stored in an expected results look-up table as illustrated in FIG. 5, which illustrates a table of operating conditions of ESD circuitry based on expected values of a first voltage drop and a second voltage drop across ESD protection circuitry. The look-up table may be stored in the memory circuitry 340, and the expected results may be based on the design parameters of the integrated circuit 100, the circuit 102, and the test currents provided.

For example, the values illustrated in FIG. 5 are the expected values in volts for the voltage drop across the depicted example circuit 102, as illustrated, where the resistor 206 is a 2000 Ohm resistor; the first ESD protection circuit 204 provides a forward voltage of 1.4 V between the signal line and the rails of the integrated circuit, the second ESD protection circuit 208 provides a forward voltage of 0.7 V between the signal line and the rails of the integrated circuit; the first test current is 100 μA; and the second test current is 1 mA. The operating conditions of the ESD protection circuit may comprise normal, short, and open for each of the ESD protection circuits.

For example, assuming the supply rail 214 (Vcc) is connected to the ground rail 216 (Vground), Vcc=Vground=0 V, and leakage current into the sensitive circuit 108 is negligible and the input is single ended (e.g., resistor 106 is not present), the voltage measured at the pad 110 is the smallest of the voltages across the first ESD protection circuit 204 and across the 2000 Ω resistor 206 plus the voltage at the second ESD protection circuit 208. In some examples, the forward diode voltage drop is related to the current through the diode. In one example, this is given through the equations:

$$V_{pad}(110) = \begin{cases} V_D(204) & \text{if } V_D(204) < V_D(208) + I_{test}(212) * R(206) \\ V_D(208) + I_{test}(212) * R(206) & \text{if } V_D(204) \geq V_D(208) + I_{test}(212) * R(206) \end{cases}$$

This may also be represented by: $V_{pad}(110) = \min\{V_{D(204)}(\text{Itest}), \text{Itest}(212)*R(206)+VD(208)(\text{Itest})\}$
In one example, given a test current of 100 μA, and $V_D(208)=0.7$ V and $V_D(204)=1.4$ V, the equation is as follows:

$$V_D(208)+I_{test}(212)*R(206)=0.7\text{ V}+100\mu A*2000\ \Omega=0.9\text{ V and hence}$$

$$V_{pad} = \begin{cases} 1.4\text{ V} & \text{if } 1.4\text{ V} < 0.9\text{ V} \\ 0.9\text{ V} & \text{if } 1.4\text{ V} \geq 0.9\text{ V} \end{cases} = 0.9\text{ V}$$

In this instance a "normal" or "open" condition for the first test current is indicated. For the second test current of 1 mA, $V_D(208)+I_{test}(212)*R(206)=0.7$ V+1 mA*2000 Ω=2.7 V which results in the following:

$$V_{pad} = \begin{cases} 1.4\text{ V} & \text{if } 1.4\text{ V} < 2.7\text{ V} \\ 2.7\text{ V} & \text{if } 1.4\text{ V} \geq 2.7\text{ V} \end{cases} = 1.4\text{ V}$$

Thus, as described in relation to block 418, that the first voltage measured indicates normal operation and the third voltage measured indicates normal operation and hence ESD diodes 204a and 204b as well as 208a are in normal condition.

In this example, if the first ESD protection circuit 204 has a normal operating condition and the second ESD protection circuit 208 has a normal operating condition, the first voltage drop and the third voltage drop will comprise 0.9 V and the second voltage drop and the fourth voltage drop will comprise 1.4 V (as a numeric or absolute voltage drop). As shown in FIG. 5, using just one current (including the inverse or negative current), such as the first test current, would not indicate whether the first ESD protection circuit 204 is open or normal because both the normal and open operating conditions include 0.9 V expected voltage drops. In the same way, using only a higher test current (1 mA) would not indicate if the operating condition of the second ESD protection circuit is normal, open, or short because each of these conditions include a 1.4 V expected voltage drop.

The determination of the operating condition of both the first ESD protection circuit and the second ESD protection circuit allows for a wafer or chip manufacturer to determine any defects in the product during the production phase and remove any faulty chip/devices from production. The detail provided by the operating conditions allows a manufacturer to identify and correct any systemic errors or faults causing the wafer/chip imperfections. For example, if the second ESD circuit or pad (the wire bonding pad 250a) is faulted (e.g., shorted or open), the manufacturing steps dealing with the second ESD circuit or pad can be inspected and changed to avoid further defects in additional wafers.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A circuit for providing electrostatic discharge (ESD) protection comprising:
    a signal line;
    a first ESD protection circuit on the signal line comprising:
        at least two ESD diodes connected between the signal line and a supply rail;
        at least two ESD diodes connected between a ground rail and the signal line, wherein the first ESD protection circuit provides a first forward voltage level; and
    a second ESD protection circuit on the signal line comprising:
        at least one ESD diode connected between the signal line and the supply rail;
        at least one ESD diode connected between the ground rail and the signal line, wherein the second ESD protection circuit provides a second forward voltage level lower than the first forward voltage level of the first ESD protection circuit,
        wherein the second ESD protection circuit comprises a fewer number of ESD diodes than the first ESD protection circuit; and
    a resistor on the signal line between the first ESD protection circuit and the second ESD protection circuit.

2. The circuit of claim 1, wherein the signal line is connected from the second ESD protection circuit to an electrically sensitive circuit, wherein the circuit is configured to receive a test current, and wherein the first ESD protection circuit and the second ESD protection circuit provide ESD protection.

3. The circuit of claim 1, wherein the circuit is a part of a differential topology in which the circuit is connected to a differential circuit by a differential resistor.

4. The circuit of claim 3, wherein the differential circuit comprises:
    a differential signal line;

a first differential ESD protection circuit on the differential signal line comprising:
  at least one ESD diode connected between the differential signal line and the supply rail;
  at least one ESD diode connected between the ground rail and the differential signal line; and
a second differential ESD protection circuit on the differential signal line comprising:
  at least one ESD diode connected between the differential signal line and the supply rail;
  at least one ESD diode connected between the ground rail and the differential signal line; and
a resistor on the differential signal line between the first differential ESD protection circuit and the second differential ESD protection circuit.

5. The circuit of claim 3, wherein the differential resistor is a 100 Ohm resistor.

6. A method for testing electrostatic discharge (ESD) protection on an integrated circuit:
providing a first test current to a circuit for testing ESD protection, wherein the circuit for testing ESD protection comprises:
  a signal line;
  a first ESD protection circuit on the signal line comprising:
    at least one ESD diode connected between the signal line and a supply rail;
    at least one ESD diode connected between a ground rail and the signal line, wherein the first ESD protection circuit provides a first forward voltage level;
  a second ESD protection circuit on the signal line comprising:
    at least one ESD diode connected between the signal line and the supply rail;
    at least one ESD diode connected between the ground rail and the signal line, wherein the second ESD protection circuit provides a second forward voltage level lower than the first forward voltage level of the first ESD protection circuit; and
  a resistor on the signal line between the first ESD protection circuit and the second ESD protection circuit;
measuring a first voltage drop across the circuit to the supply rail;
providing a second test current to the circuit;
measuring a second voltage drop across the circuit to the supply rail;
providing a third test current to the circuit, wherein the third test current is a negative of the first test current;
measuring a third voltage drop across the circuit to the ground rail;
providing a fourth test current to the circuit wherein the fourth test current is a negative of the second test current;
measuring a fourth voltage drop across the circuit to the ground rail; and
determining an operating condition for the first ESD protection circuit and the second ESD protection circuit based on expected values of the first voltage drop, the second voltage drop, the third voltage drop, and the fourth voltage drop.

7. The method of claim 6,
wherein the first test current corresponds to a first voltage that is lower than the first forward voltage level and at least equal to the second forward voltage level; and
wherein the second test current corresponds to a second voltage that is at least equal to the first forward voltage level.

8. The method of claim 6, wherein the first ESD protection circuit and the second ESD protection circuit are connected to ground during a test of ESD protection on the integrated circuit.

9. The method of claim 6, wherein the signal line is connected to an electrically sensitive circuit, wherein the circuit is further connected to an input pad, wherein the first ESD protection circuit and the second ESD protection circuit provide ESD protection, and wherein the input pad is floating in an instance in which the circuit is not being tested.

10. The method of claim 6, wherein the circuit is a part of a differential topology in which the circuit is connected to a differential circuit by a differential resistor.

11. The method of claim 10, wherein the differential circuit comprises:
a differential signal line;
a first differential ESD protection circuit on the differential signal line comprising:
  at least one ESD diode connected between the differential signal line and the supply rail;
  at least one ESD diode connected between the ground rail and the differential signal line; and
a second differential ESD protection circuit on the differential signal line comprising:
  at least one ESD diode connected between the differential signal line and the supply rail;
  at least one ESD diode connected between the ground rail and the differential signal line; and
a resistor on the differential signal line between the first differential ESD protection circuit and the second differential ESD protection circuit.

12. The method of claim 10, wherein the differential resistor is a 100 Ohm resistor.

13. An apparatus for testing electrostatic discharge (ESD) protection on an integrated circuit comprising at least one processor and at least one memory including computer program code, the at least one memory and the computer program code configured to, with the processor, cause the apparatus to at least:
provide a first test current to a circuit for testing ESD protection, wherein the circuit for testing ESD protection comprises:
  a signal line;
  a first ESD protection circuit on the signal line comprising:
    at least one ESD diode connected between the signal line and a supply rail;
    at least one ESD diode connected between a ground rail and the signal line, wherein the first ESD protection circuit provides a first forward voltage level;
  a second ESD protection circuit on the signal line comprising:
    at least one ESD diode connected between the signal line and the supply rail;
    at least one ESD diode connected between the ground rail and the signal line, wherein the second ESD protection circuit provides a second forward voltage level lower than the first forward voltage level of the first ESD protection circuit; and
  a resistor on the signal line between the first ESD protection circuit and the second ESD protection circuit;

measure a first voltage drop across the circuit to the supply rail;
provide a second test current to the circuit;
measure a second voltage drop across the circuit to the supply rail;
provide a third test current to the circuit, wherein the third test current is a negative of the first test current;
measure a third voltage drop across the circuit to the ground rail;
provide a fourth test current to the circuit wherein the fourth test current is a negative of the second test current;
measure a fourth voltage drop across the circuit to the ground rail; and
determine an operating condition for the first ESD protection circuit and the second ESD protection circuit based on expected values of the first voltage drop, the second voltage drop, the third voltage drop, and the fourth voltage drop.

14. The apparatus of claim 13,
wherein the first test current corresponds to a first voltage that is lower than the first forward voltage level and at least equal to the second forward voltage level; and
wherein the second test current corresponds to a second voltage that is at least equal to the first forward voltage level.

15. The apparatus of claim 13, wherein the first ESD protection circuit and the second ESD protection circuit are connected to ground during a test of ESD protection on the integrated circuit.

16. The apparatus of claim 13, wherein the signal line is connected to an electrically sensitive circuit, wherein the circuit is further connected to an input pad, wherein the first ESD protection circuit and the second ESD protection circuit provide ESD protection, and wherein the input pad is floating in an instance in which the circuit is not being tested.

17. The apparatus of claim 13, wherein the circuit is a part of a differential topology and wherein the circuit is connected to a differential circuit by a differential resistor, wherein the differential resistor is a 100 Ohm resistor and wherein the differential circuit comprises:
a differential signal line;
a first differential ESD protection circuit on the differential signal line comprising:
at least one ESD diode connected between the differential signal line and the supply rail;
at least one ESD diode connected between the ground rail and the differential signal line; and
a second differential ESD protection circuit on the differential signal line comprising:
at least one ESD diode connected between the differential signal line and the supply rail;
at least one ESD diode connected between the ground rail and the differential signal line; and
a resistor on the differential signal line between the first differential ESD protection circuit and the second differential ESD protection circuit.

18. A circuit for providing electrostatic discharge (ESD) protection comprising:
a signal line;
a first ESD protection circuit on the signal line comprising:
at least one ESD diode connected between the signal line and a supply rail;
at least one ESD diode connected between a ground rail and the signal line, wherein the first ESD protection circuit provides a first forward voltage level; and
a second ESD protection circuit on the signal line comprising:
at least one ESD diode connected between the signal line and the supply rail;
at least one ESD diode connected between the ground rail and the signal line, wherein the second ESD protection circuit provides a second forward voltage level lower than the first forward voltage level of the first ESD protection circuit; and
a resistor on the signal line between the first ESD protection circuit and the second ESD protection circuit,
wherein the circuit is a part of a differential topology in which the circuit is connected to a differential circuit by a differential resistor.

19. The circuit of claim 18, wherein the differential circuit comprises:
a differential signal line;
a first differential ESD protection circuit on the differential signal line comprising:
at least one ESD diode connected between the differential signal line and the supply rail;
at least one ESD diode connected between the ground rail and the differential signal line; and
a second differential ESD protection circuit on the differential signal line comprising:
at least one ESD diode connected between the differential signal line and the supply rail;
at least one ESD diode connected between the ground rail and the differential signal line; and
a resistor on the differential signal line between the first differential ESD protection circuit and the second differential ESD protection circuit.

20. The circuit of claim 18, wherein the signal line is connected from the second ESD protection circuit to an electrically sensitive circuit, wherein the circuit is configured to receive a test current, and wherein the first ESD protection circuit and the second ESD protection circuit provide ESD protection.

* * * * *